United States Patent [19]

Lin

[11] Patent Number: 4,769,689
[45] Date of Patent: Sep. 6, 1988

[54] STRESS RELIEF IN EPITAXIAL WAFERS

[75] Inventor: Wen Lin, Lower Macungie Township, Lehigh County, Pa.

[73] Assignee: American Telephone and Telegraph Company, AT&T Bell Laboratories, Murray Hill, N.J.

[21] Appl. No.: 73,296

[22] Filed: Jul. 13, 1987

Related U.S. Application Data

[63] Continuation-in-part of Ser. No. 681,310, Dec. 13, 1984, abandoned.

[51] Int. Cl.⁴ .......................................... H01L 29/167
[52] U.S. Cl. .......................................... 357/63; 357/64
[58] Field of Search .................................... 357/63, 64

[56] References Cited

U.S. PATENT DOCUMENTS 3,812,519 5/1974 Nakamura ..................... 357/63 X

OTHER PUBLICATIONS

Edel et al, *I.B.M. Tech. Discl. Bull.*, vol. 13, No. 3, Aug. 1970.

*Primary Examiner*—Martin H. Edlow
*Attorney, Agent, or Firm*—Richard D. Laumann

[57] ABSTRACT

The specification describes an epitaxial structure designed to reduce or eliminate the bowing of semiconductor wafers due to stresses caused by lattice mismatch between a heavily boron doped substrate and a lightly doped epitaxial layer. The lattice mismatch is reduced or eliminated by doping germanium into the substrate prior to epitaxial growth.

4 Claims, 2 Drawing Sheets

LATTICE CONTRACTION 0.014 Å / AT % B

LATTICE PARAMETER

AT % B

LATTICE EXPANSION 0.0022 Å / AT % Ge

LATTICE PARAMETER

AT % Ge

STRESS RELIEF IN EPITAXIAL WAFERS

This application is a continuation-in-part of application Ser. No. 681,310, filed 12/13/84.

BACKGROUND OF THE INVENTION

Two of the important driving forces in the progress of semiconductor integrated circuits are reduction in the size of individual devices so the packing density per chip site increases, and increase in the size of the wafers used in integrated circuit production so the number of chip sites per wafer increases. Both forces impact directly the cost per integrated circuit device. A limiting factor on the continuing evolution of both of these forces is the increasing role of surface variations or undulations due to bowing of the wafers. The most consequential effect of these variations is on lithographic processing because the projected lithographic image does not have sufficient depth of field to provide acuity over the whole wafer. Means have been devised to refocus the image at each site of the wafer using a wafer stepper lithography apparatus, but the depth of the wafer plane may vary over a distance corresponding to a single chip site. It is intuitively evident that increasing the diameter of the wafer in order to increase the number of chip sites and reduce the cost per chip for a given processed wafer cost will further complicate the bowing and warping problem.

Wafer warpage caused by thermomechanical effects during processing also contributes to the problem just described. Differential strains of other kinds will also aggravate the problem. One of these is the lattice strain produced by the introduction of large quantities of dopants into the substrate onto which an epitaxial layer is grown. The usual objective in epitaxial structures is to make a relatively lightly doped or high resistivity layer, typically 1-10 ohm cm, on a relatively heavily doped or conductive substrate, typically 0.1 to 0.002 ohm cm. Commonly the approach is to deposit a lightly doped p-type layer on a heavily boron doped substrate. These structures tend to exhibit bowing due to the crystal lattice mismatch between the heavily born doped substrate and the more nearly intrinsic silicon epitaxial layer. The substitution of boron in large concentrations into the substrate crystal shrinks the lattice parameter of the substrate. The deposition of relatively pure silicon on this substrate causes stresses to develop in the epitaxial layer. As the layer becomes thicker these stresses develop sufficiently to cause strains in the layer which in turn cause bowing of the epitaxial wafer.

STATEMENT OF THE INVENTION

I have discovered that the lattice mismatch stress, and resulting strains in epitaxial wafers, comprising a lightly doped silicon epitaxial layer onto heavily boron doped silicon substrate, can be relieved significantly by doping germanium in the substrate silicon crystal. The germanium increases the lattice parameter of the silicon host crystal and compensates for the decrease or shrinkage by the heavy boron concentration.

DESCRIPTION OF SPECIFIC EMBODIMENT

Figure 1:
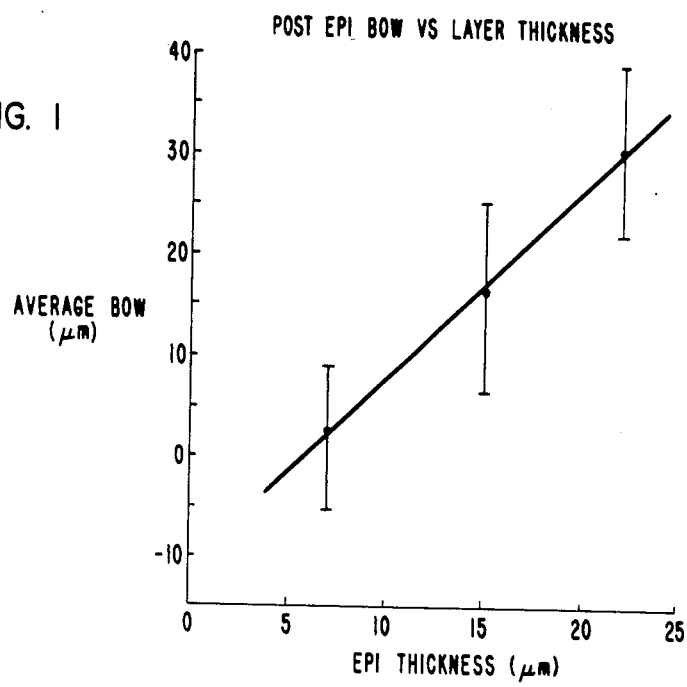
Figure 2:
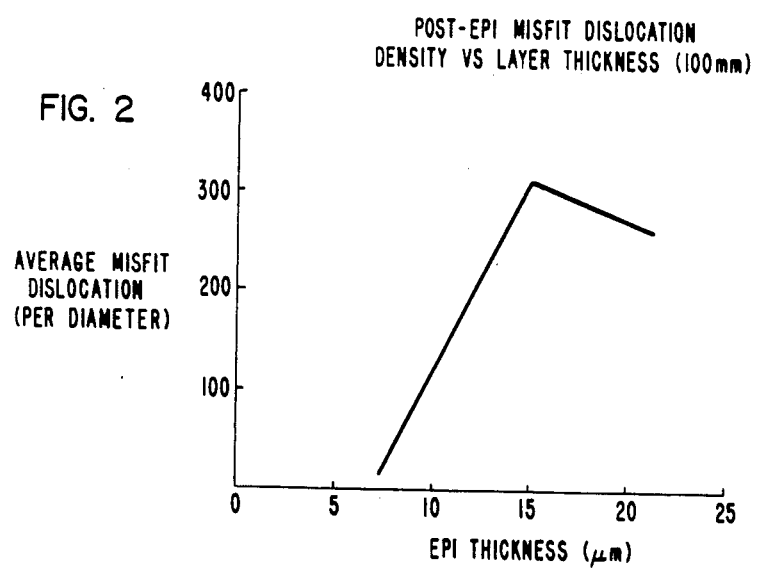
Figure 3:
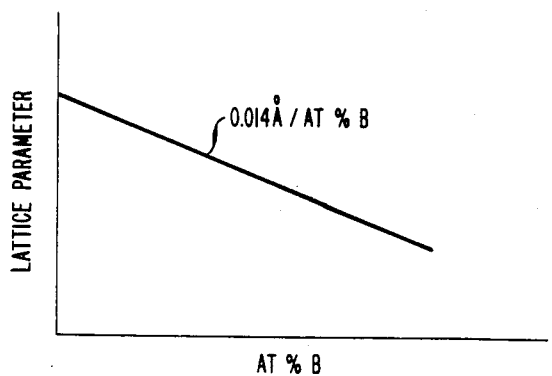
Figure 4:
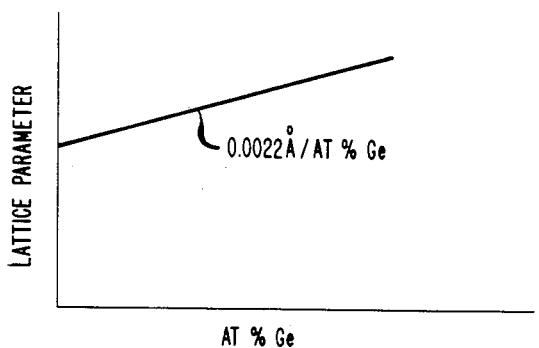

As an example, a silicon substrate is doped with a boron concentration of $8 \times 10^{18}$. The conductivity type, as is well known, of boron doped silicon is p-type. This doping level corresponds to a resistivity of approximately 0.01 ohm cm. Wafers (100 mm or 125 mm) with epi layers deposited on substrates with this doping level have been found to exhibit substantial bowing. The degree of bowing increases, as expected, with the thickness of the epi layer. Observed examples of this provided data for the plot of FIG. 1 which shows bowing in micrometers vs. layer thickness. This data correlates somewhat with the data of FIG. 2 which plots misfit dislocation density at the epi/substrate interface with epi layer thickness. The variation in lattice parameter with the boron doping level is shown in FIG. 3. The lattice distortion caused by the aforementioned doping level is approximately 0.00022 Å and the doping level corresponds to approximately 0.016 atomic % of boron in the doped silicon material. The variation of lattice parameter for the germanium compensation doping material is shown in FIG. 4. To restore the lattice parameter to a value to match the epitaxial material to be deposited requires approximately 0.097 atomic % of germanium by theoretical calculation ($C_{Ge}/C_B \%6$). Experimentally, it was found that the concentration ratio of $C_{Ge}/C_B$ for complete lattice compensation is approximately 8. This value is greater than that calculated theoretically. A concentration ratio deviating from the experimental ratio results in a lesser degree of lattice compensation and stress relief.

The material is thereby rendered essentially stress free and will not generate substantial strains regardless of the thickness of the epitaxial layer. Stated another way, the germanium doping of the invention removes the relationship between the degree of bowing and the thickness of the epitaxial layer thus eliminating a significant technological design impediment for designers of integrated circuit devices.

It will be readily appreciated by those skilled in the art that Ge is isoelectronic with respect to Si, i.e., it does not change the conductivity type of the substrate.

The invention is advantageously applicable to heavily boron doped substrates, i.e. those incorporating more than 0.002 atomic %, and preferably 0.01 atomic % boron. It is also advantageously applicable to epitaxial structures with epitaxial thicknesses greater than 5 μm. The invention may be advantageously employed with layers as thin as 3 μm.

Various additional modifications and extensions of this invention will become apparent to those skilled in the art. Also, the substrate resistivity may be as high as 0.02 ohm cm. All such variations and deviations which basically rely on the teachings through which this invention has advanced the art are properly considered to be within the spirit and scope of this invention.

What is claimed is:

1. Expitaxial structure comprising a silicon substrae and an epitaxial layer on the silicon substrate,
    said substrate containing boron and germanium dopants, said substrate has p-type conductvity, said germanium dopant not changing said conductivity type,
    the respective amounts of boron (B) and germanium (Ge) contained in the substrate are approximately related by the expression:

$$C_{GE} = \text{approximately } 8C_B$$

where C is concentration in atomic %.

2. Structure of claim 1 in which $C_B$ is greater than 0.002 atomic %.

3. Structure of claim 1 in which $C_B$ is greater than 0.01 atomic %.

4. Structure of claim 1 in which the epitaxial layer is silicon with a thickness of greater than 3 μm.

* * * * *